US012724050B2

(12) United States Patent
Yang et al.

(10) Patent No.: US 12,724,050 B2
(45) Date of Patent: Sep. 1, 2026

(54) METHOD AND SYSTEM FOR MODELING DEVICE UNDER TEST HAVING MULTIPLE ANTENNAS

(71) Applicant: Keysight Technologies, Inc., Santa Rosa, CA (US)

(72) Inventors: Huaizhi Yang, Beijing (CN); Jukka Antero Kyrolainen, Oulu (FI); Lassi Hentila, Kempele (FI); Jin-Ming Zhao, Beijing (CN)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 645 days.

(21) Appl. No.: 18/116,538

(22) Filed: Mar. 2, 2023

(65) Prior Publication Data

US 2023/0324445 A1 Oct. 12, 2023

(30) Foreign Application Priority Data

Apr. 11, 2022 (CN) ......................... 202210375124.2

(51) Int. Cl.
*G01R 29/08* (2006.01)

(52) U.S. Cl.
CPC ..... *G01R 29/0871* (2013.01); *G01R 29/0892* (2013.01)

(58) Field of Classification Search
CPC ............ G01R 29/0871; G01R 29/0892; H04B 17/3912; H04B 7/0413
See application file for complete search history.

(56) References Cited

U.S. PATENT DOCUMENTS

| | | | |
|---|---|---|---|
| 7,508,868 B2 | 3/2009 | Chang | |
| 9,282,477 B2 | 3/2016 | Sevindik et al. | |
| 10,313,034 B2 | 6/2019 | Rodriguez-Herrera et al. | |
| 12,078,667 B1 * | 9/2024 | Nuutinen ............ | G01R 29/105 |

(Continued)

FOREIGN PATENT DOCUMENTS

WO 2021175344 A2 9/2021

OTHER PUBLICATIONS

Keysight Technologies, PROPSIM F64 5G Channel Emulation Solution—F8800A, Apr. 24, 2018, Keysight Technologies, pp. 2-5 (Year: 2018).*

(Continued)

*Primary Examiner* — Catherine T. Rastovski

(57) ABSTRACT

A method for modeling an NR DUT using a MIMO OTA test system including a BTS configured to send and receive RF test signals to and from the DUT, and probes configured to reproduce a three-dimensional fading environment for the DUT placed in a quiet zone of an anechoic chamber in response to the RF test signals. The method includes building CIR files for fading channels provided by a channel emulator in the MIMO OTA test system; selecting preferred CIR files from the CIR files having corresponding channel power levels higher than a threshold corresponding to a minimum power level; and performing bi-directional fading emulation with the fading channels using the preferred CIR files, where remaining CIR files are disregarded. The probes reproduce the three-dimensional fading environment for the DUT in the quiet zone using the RF test signals adjusted by the bi-directional fading emulation with the fading channels.

20 Claims, 6 Drawing Sheets

(56) References Cited

U.S. PATENT DOCUMENTS

| | | | | |
|---|---|---|---|---|
| 2008/0056340 | A1* | 3/2008 | Foegelle | H04B 17/29 375/224 |
| 2012/0098713 | A1* | 4/2012 | Mow | H04B 17/0087 343/703 |
| 2013/0027256 | A1* | 1/2013 | Guo | H04W 24/06 343/703 |
| 2016/0285572 | A1* | 9/2016 | Manghal | H04B 17/0085 |
| 2019/0271775 | A1* | 9/2019 | Zhang | G01S 13/003 |
| 2019/0280791 | A1* | 9/2019 | Dhananjay | H03H 17/06 |
| 2023/0288547 | A1* | 9/2023 | Ernström | G01S 5/0221 |
| 2023/0291610 | A1* | 9/2023 | Pakrooh | H04L 25/0212 |
| 2024/0319310 | A1* | 9/2024 | Alawieh | G01S 5/0036 |

OTHER PUBLICATIONS

English translation of WO2021175344, 21 pgs.

"3rd Generation Partnership Project; Technical Specification Group Radio Access Network; NR; Multiple Input Multiple Output (MIMO) Over-the-Air (OTA) performance requirements for NR UEs (Release 17)", 3GPP TS 38.151 V0.6.0 (Nov. 2011), pp. 1-53.

"3rd Generation Partnership Project; Technical Specification Group Radio Access Network; Study on radiated metrics and test methodology for the verification of multi-antenna reception performance of NR User Equipment (UE); (Release 16)", 3GPP TR 38.827 V16.3.0 (Jun. 2021), pp. 1-83.

* cited by examiner

METHOD AND SYSTEM FOR MODELING DEVICE UNDER TEST HAVING MULTIPLE ANTENNAS

PRIORITY

This application claims priority under 35 U.S.C. § 119 to Chinese Patent Application No. 202210375124.2, filed on Apr. 11, 2022, in the State Intellectual Property Office of the People's Republic of China, the disclosure of which is hereby specifically incorporated by reference in its entirety.

BACKGROUND

Channel emulators are used for testing multiple-input and multiple-output (MIMO) over-the-air (OTA) test systems, which include creating fading environments with specific model parameters and time variant statistics of a fast fading profile, such as path loss, power-delay profile (PDP), Doppler information, and spatial information of each tap, for example, MIMO OTA test systems may be arranged according to various industry standards, such as the China Mobile Communications Corporation (CMCC) standard, for example, which provides end-to-end test methodology to verify multi-antenna performance of new radio (NR) user equipment (UE) in frequency range 1 (FR1) band, for example.

The channel emulator of a conventional MIMO OTA test system may include 16 input ports and 16 output ports connected to a 64-element massive-MIMO base transceiver station (BTS) through a MIMO Channel System (MC S), and various numbers of input and output ports connected to probes on the device under test (DUT) side to reproduce a three-dimensional (3D) fading environment. For example, the channel emulator may include 24 input ports and 24 output ports to connect to 24 probes, thereby providing a 16×24 bi-directional fading emulation.

The 16×24 bi-directional fading emulation requires increased hardware resources on the channel emulator side of the MIMO OTA test system. A single conventional channel emulator cannot cover the 24 probes. Therefore, either multiple channel emulators are used to support the 24 probes, or one channel emulator is used to support a select number of probes fewer than 24. Use of multiple channel emulators in particular downgrades the stability of the entire MIMO OTA test system, and requires accurate synchronization between the channel emulators, which may cause additional uncertainty. Also, a special cooling system is needed for higher power consumption of the additional channel emulator(s), which required an ~8 kW in power supply. Also, the cost of MIMO OTA test system increases correspondingly with the additional channel emulator(s), which inhibits building the same system at other customer sites in standard based eco-system.

For example, a F64 Radio Channel Emulator F8800A (F64 Channel Emulator), available from Keysight Technologies, Inc., provides 16 input ports and 16 output ports for connecting to a BTS, and 24 input ports and 24 output ports for connecting to probe antennas. Generally, performing 16×24 bi-directional fading emulation requires 768 fading channels (16×24×2). The user may achieve this by combining two F64 Channel Emulators having 48 radio frequency (RF) channels for connecting to the 24 probes. However, using two channel emulators has the drawbacks discussed above, including the need for a very accurate sync up between the two F64 Channel Emulators. Alternatively, the user may use a single F64 Channel Emulator having 64 RF channels, which is a less expensive and more reliable hardware solution. However, the 64 RF channels are able to connect with only 16 probes as opposed to 24 probes, so four probes must be removed from the test. For example, the top 16 probes may be prioritized and selected based on probe weight, which is determined using angles of arrival (AoAs) of the various probes. This solution therefore effectively provides 16×20 bi-directional fading emulation. Also, different cable connections must be implemented for the different probe mapping by different channel models for the selected probes.

What is needed therefore is a way to perform 16×24 bi-directional fading emulation using a single channel emulator, without having to sacrifice probe connections, thereby using fewer resources to reproduce the same environment.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
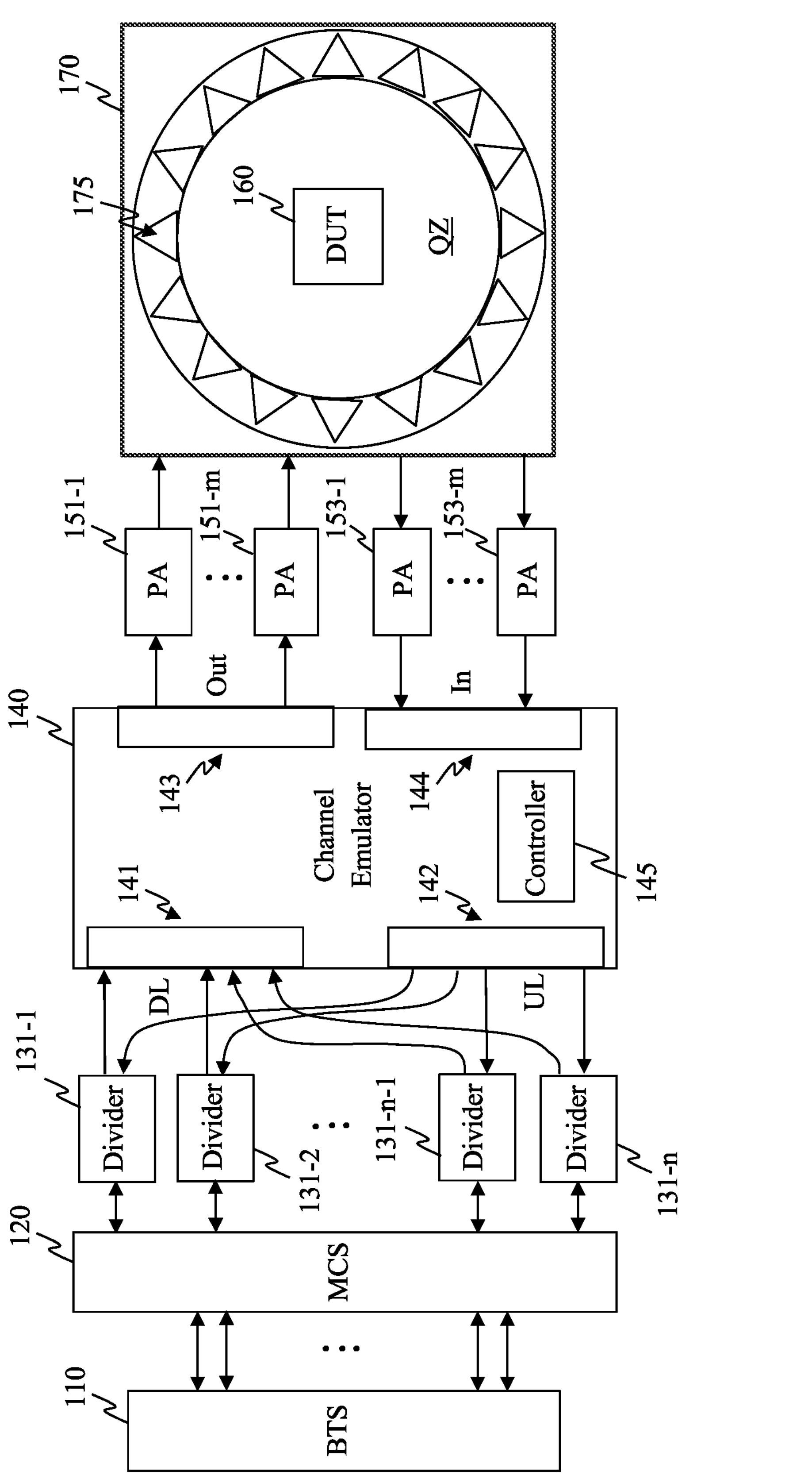
FIG. 1 is a simplified block diagram of a MIMO OTA test system of testing a DUT, according to a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

According to a representative embodiment, a multiple-input multiple-output (MIMO) over-the-air (OTA) test system is provided for modeling a device under test (DUT) having multiple antennas. The system includes a base transceiver station (BTS) configured to send and receive radio frequency (RF) test signals to and from the DUT, where the RF test signals are modulated in accordance with a NR signal and dynamic modulation and coding scheme; multiple probes configured to reproduce a three-dimensional fading environment for the DUT placed in a quiet zone of an anechoic chamber in response to the RF test signals, where the three-dimensional fading environment is a predefined channel model provided in a standard specification or in customer requirements; and a channel emulator including multiple input/output ports connectable to the BTS, multiple input/output ports respectively connectable to the probes, and a processing unit configured to perform bi-directional fading emulation with a multiple fading channels according to the predefined channel model. The processing unit of the channel emulator is programmed to build multiple channel impulse response (CIR) files for the multiple fading channels; select preferred CIR files from the CIR files; and revise the bi-directional fading emulation with the fading channels using the preferred CIR files, where unselected CIR files of the CIR files are disregarded. The probes reproduce the three-dimensional fading environment for the DUT in the quiet zone using the RF test signals adjusted by the revised bi-directional fading emulation with the fading channels.

According to another representative embodiment, a method is provided for modeling a DUT having multiple antennas using a MIMO OTA test system having a BTS configured to send and receive RF test signals to and from the DUT, and multiple probes configured to reproduce a three-dimensional fading environment for the DUT placed in a quiet zone of an anechoic chamber in response to the RF test signals. The method includes building a multiple CIR files for multiple fading channels provided by a channel emulator in the MIMO OTA test system; selecting preferred CIR files from the multiple CIR files; and performing bi-directional fading emulation with the fading channels using the preferred CIR files, where remaining CIR files of the multiple CIR files not selected are disregarded. The probes reproduce the three-dimensional fading environment for the DUT in the quiet zone using the RF test signals adjusted by the bi-directional fading emulation with the multiple fading channels.

According to another representative embodiment, a non-transitory computer readable medium is provided that stores instructions for modeling a DUT having multiple antennas using a MIMO OTA test system that includes a BTS configured to send and receive RF test signals to and from the DUT, and multiple probes. The instructions, when executed, cause a processing unit to build multiple CIR files for multiple fading channels provided by a channel emulator in the MIMO OTA test system; select preferred CIR files from the multiple CIR files; and perform bi-directional fading emulation with the multiple fading channels using the preferred CIR files, where remaining CIR files of the multiple CIR files not selected are disregarded. The multiple probes reproduce a three-dimensional fading environment for the DUT placed in a quiet zone of an anechoic chamber using the RF test signals adjusted by the bi-directional fading emulation with the multiple fading channels.

FIG. 1 is a simplified block diagram of a MIMO OTA test system of testing a DUT, according to a representative embodiment.

Referring to FIG. 1, MIMO OTA test system 100 includes a channel emulator 140 configured to perform bi-directional fading emulation for testing a DUT 160, such as a cellular telephone, placed in a quiet zone QZ of an anechoic chamber 170. The DUT 160 is assumed to have multiple antennas. The channel emulator 140 emulates the bi-dimensional fading environment by applying a predefined channel model to RF signals provided by a BTS 110 and MIMO Channel System (MCS) 120, discussed below. The predefined channel model may be provided in a standard specification and/or in customer requirements, as would be apparent to one skilled in the art, and is used to evaluate performance of the DUT 160. The predefined channel model may be a geometric based clustered delay line (CDL) channel model, for example. In this case, the CDL channel model may be a CMCC or other standard based CDL channel model, for example.

The anechoic chamber 170 includes multiple antenna probes 175 in a substantially circular arrangement, creating the quiet zone QZ. Emulation signals provided by the predefined channel model from the channel emulator 140 are output to the probes 175, and DUT signals generated by the DUT 160 are input to the channel emulator 140 from the probes 175. The probes 175 reproduce the three-dimensional fading environment for the DUT 160 in the quiet zone QZ using the emulation signals adjusted by the revised bi-directional fading emulation with the fading (logical) channels. In the depicted example, the anechoic chamber 170 includes 24 probes 175, which surround the DUT 160 placed in the quiet zone QZ. The 24 probes 175 may be arranged in three probe rings, including a top probe ring (not shown) having 4 evenly spaced probes 175 (positioned at 90 degree intervals), a middle probe ring shown in FIG. 1 including 16 evenly spaced probes 175 (positioned at 22.5 degree intervals), and a bottom ring (not shown) having 4 evenly spaced probes 175 (positioned at 90 degree intervals), for example. Of course, number and arrangement of the probes 175 may vary to provide unique benefits for any particular situation or to meet application specific design requirements of various implementations, as would be apparent to one skilled in the art.

The MIMO OTA test system 100 further includes dividers 131-1, 131-2 . . . 131-*n*−1, and 131-*n*. The dividers 131-1 to 131-*n* are configured to separate downlink (DL) RF signals received from the MCS 120 and provided to the channel emulator 140 from uplink (UL) RF signals received from the channel emulator 140 and provided to the MCS 120. The channel emulator 140 includes first input ports 141 connectable to the BTS 110 via the dividers 131-1 to 131-*n* and the MCS 120 for receiving the downlink RF signals, and first output ports 142 connectable to the BTS 110 via the dividers 133-1 to 133-*n* and the MCS 120 for sending the uplink RF signals. The number n of the dividers 131-1 to 131-*n* is equal to the number of each of the first input ports and the first output ports of the channel emulator 140, e.g., n=16 in the present example.

The BTS 110 is configured to provide RF signals to the MCS 120, which implements a dynamic modulation and coding scheme. The dynamic modulation and coding scheme defines transmission parameters, such as modulation type, number of spatial streams and data rate on each spatial stream, based on the quality of the radio link. The higher the quality, the more useful data can be transmitted per the dynamic modulation and coding scheme. The dynamic modulation and coding scheme may be continuously adjusted by the MCS 120 in response to condition changes, such as those caused by interference, motion, fading, and the like. Thus, the RF signals are modulated by the MCS 120 in accordance with an NR signal and the dynamic modulation and coding scheme. The BTS 110 is also configured to receive RF signals from the MCS 120 originating at the DUT 160.

The channel emulator 140 includes first input ports 141 and first output ports 142 respectively connectable to the BTS 110, and second output ports 143 and second input ports 144 respectively connectable to the probes 175. For example, the channel emulator 140 may include 16 first input ports 141 for receiving downlink RF signals from the BTS 110 and 16 first output ports 142 for sending uplink RF signals to the BTS 110. Further, for example, the channel emulator 140 may include 24 second output ports 143 for sending emulation signals to the 24 probes 175 and second input ports 144 for receiving DUT signals from the 24 probes 175. In this example, the channel emulator 140 provides 16×24 (384) downlink fading channels and 24×16 (384) uplink fading channels for which bi-directional fading emulation is performed.

The channel emulator 140 is configured to create appropriate channel impairments for both downlink and uplink transmissions between the BTS 110 and the DUT 160. The resulting field distribution in the quiet zone QZ is integrated by the antennas of the DUT 160, and processed by the receivers as would be done in a non-simulated multipath environment. In the depicted embodiment, the MIMO OTA test system 100 further includes power amplifiers 151-1 to 151-*m* for amplifying the emulation signals output from the second output ports 143 sent to the probes 175, and power amplifiers dividers 153-1 to 153-*m* for amplifying the DUT signals input to the second input ports 144 received from the probes 175. The number of power amplifiers m is the number of each of the second output ports 143 and second input ports 144 in the MIMO OTA test system 100, e.g., m=24 in the present example.

The channel emulator 140 also includes a controller 145 comprising a processing unit 146 and a memory 147, discussed in more detail below with reference to FIG. 7. The memory 147 stores instructions that, when executed, cause the processing unit 146 to perform bi-directional fading emulation with the multiple fading channels according to the predefined channel model. The bi-directional fading emulation is optimized, according to a process discussed below with reference to FIG. 2, to enable the bi-directional fading emulation with regard to all fading channels using fewer hardware resources than needed for conventional channel emulators. For example, in the depicted embodiment, the bi-directional fading emulation may be performed with regard to all fading channels (e.g., 16×24×2) using an F64 Channel Emulator having only 40 RF channels for connecting with 24 probes 175 (20 downlink RF channels and 20 uplink RF channels), as opposed to using two F64 Channel Emulators having 48 RF channels for emulating 16×24×2 fading channels or one F64 Channel Emulator having 64 RF channels for emulating only 16×16×2 fading channels, as discussed above. Generally, the controller 145 is programmed to build channel impulse response (CIR) files for the fading channels, and select only those CIR files that have corresponding power levels higher than a minimum power level for performing the optimized bi-directional fading emulation.

Figure 2:
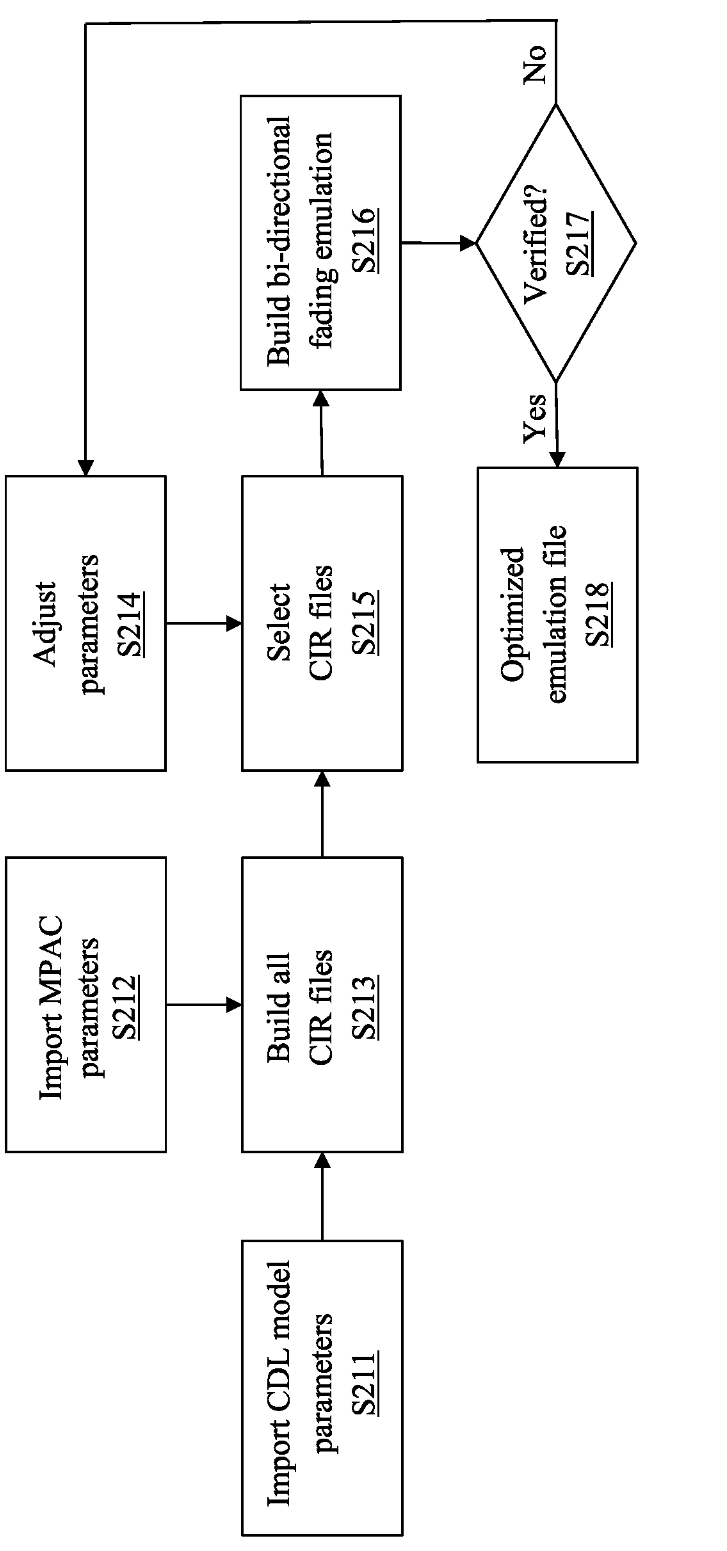
FIG. 2 is a simplified flow diagram illustrating a method of modeling an NR DUT having multiple antennas using the MIMO OTA test system, according to a representative embodiment.

FIG. 2 is a simplified flow diagram illustrating a method of modeling an NR DUT having multiple antennas using MIMO OTA test system 100, according to a representative embodiment. The method may be provided as instructions stored in the memory 147 and executable by the processing unit 146, for example, discussed above.

Referring to FIG. 2, parameters of a predefined channel model, such as a standard clustered delay line (CDL) channel model, are imported from a user interface (e.g., interface 148 discussed below) in block S211 and multi-probe anechoic chamber IMPAC) parameters of the MIMO OTA test system are imported from the user interface in block S212. The CDL channel model may provide full 2D and partial 3D fading channels, and may be optimized from 3rd Generation Partnership Project (3GPP) technical report (TR) 38.901, for example, which is hereby incorporated by reference in its entirety. The CDL channel model parameters are provided in delay, power, and spatial domains. The 3GPP TR 38.901 generally provides for clustering angle information inside the BTS coverage, merging clusters that have the same cluster angle, removing clusters having relative power that is less than −12 dB, and closing the maximum delay spread to the original delay spread. The four strongest clusters are selected on the BTS side of the channel emulator. The MPAC parameters may be provided according to industry standard, such as the CMCC standard, for example. MPAC parameters generally provide for probe placement for downlink and uplink communications, including azimuths and elevations of the respective probes.

In block S213, all CIR files are built for a standard fading channel arrangement (e.g., 16×24 fading channels) using the imported CDL channel model parameters and the imported MPAC parameters, as would be apparent to one skilled in the art. For example, when there are 16×24 fading channels, a total of 768 CIR files (384 CIR files for downlink fading channels and 384 CIR files for fading channels) will be built by the channel emulator. The CIR files may be built in accordance with 3GPP TR 38-901 and/or 3GPP TR 38-827, for example, as would be apparent to one skilled in the art. 3GPP TR 38-901 and/or 3GPP TR 38-827 are hereby incorporated by reference in their entireties.

In block S215, preferred CIR files are selected from among the CIR files built in block S213. In an embodiment, the preferred CIR files are selected based on a previously set threshold for a logical channel minimum power level of the CIR files. For example, the threshold may be initially set to 30 dB, and the minimum power level may be determined by 30 dB lower than peak CIR. The threshold may be set automatically by the controller 145 or manually by a user interfacing with the controller 145 via interface 148, discussed below. When set automatically, the threshold may be selected using a single index or multiple indexes with different priorities. The CIR files selected as the preferred CIR files are those having corresponding channel power levels that are higher than the threshold. Selecting the preferred CIR files may include calculating absolute power for each of the CIR files, and normalizing the level of the calculated absolute power for each of the CIR files compared with the peak power of all of the CIR files. The normalized power level of each of the CIR files is compared to the threshold, and the CIR files having normalized power levels that exceed the threshold are selected. The unselected CIR files (the CIR files having normalized power levels that do not exceed the threshold) are disregarded or otherwise ignored.

In another embodiment, the preferred CIR files are selected by minimizing the channel model verification metric error of the CIR files, without having to set a threshold. Minimizing the channel model verification metric error of the CIR files includes performing an iteration loop of different random selections of the CIR files and determining the corresponding channel model verification metric errors. The CIR files having the fewest channel model verification metric errors are selected to be the preferred CIR files. The cutoff for the fewest channel model verification metric errors may be determined relative to the CIR files to assure a sufficient number of preferred CIR files are selected. Minimizing the channel model verification metric error of the CIR files may include power weighting of channel selection probability within each iteration loop. Power weighting includes setting probabilities for the CIR files based on the respective powers of the CIR files. During CIR file selection, the CIR files with higher powers have higher probabilities of being selected, respectively.

In block S216, a bi-directional fading emulation file with the multiple fading channels is built using the preferred CIR files selected in block S215, and not using the unselected CIR files. The bi-directional fading emulation file is built according to the predefined CDL channel model, as would be apparent to one skilled in the art.

In block S217, the bi-directional fading emulation file is verified, meaning that it is determined whether the bi-directional fading emulation file is suitable for creating an adequate two-dimensional and/or three-dimensional fading environment for the DUT 160 in the quiet zone QZ to provide useful test results. In an embodiment, the verifying may include software level validation using MATLAB®, available from The MathWorks, Inc., for example, and key performance indicator (KPI) software testing of the predefined channel model used to build the bi-directional fading emulation file. Types of KPI software testing may include power delay profile (PDP) and/or cross polarization ratio (XPR) testing in the time domain, Doppler testing in the frequency domain, and spatial correlation testing in the spatial domain, as described in 3GPP TR 38.151, for example, which is hereby incorporated by reference in its entirety.

PDP testing checks that the PDP is in line with a PDP defined for the CDL channel model. The PDP testing generally includes transmitting frequency sweep signals through the MIMO OTA test system, receiving the signals at a reference antenna (dipole antenna) in the center of the quiet zone, and analyzing frequency response of the system using a vector network analyzer (VNA), for example. A number of frequency responses are measured and recorded by the VNA and analyzed by post processing software, such as MATLAB®, for verification.

XPR testing checks how well measured vertically polarized and/or horizontally polarized power levels follow expected values. The XPR testing generally includes measuring the absolute power received at the center of the quiet zone, averaged over a statistically significant number of fades, using a vertically polarized sleeve dipole to measure the vertical (V) component, and using a horizontally polarized (vertically oriented) magnetic loop dipole or a horizontally polarized sleeve dipole to measure the horizontal (H) component. The V/H ratio provides the cross polarization ratio for verification.

Doppler testing checks Doppler correlation. The Doppler testing generally includes transmitting a carrier wave (CW) signal generated by a signal generator through the MIMO OTA test system, and receiving the CW signal at a test antenna within the quiet zone, where the test antenna may be an antenna in the DUT. The received signal is measured by a spectrum analyzer, for example, and compared to a target spectrum for verification.

Spatial correlation testing checks whether a measured correlation curve follows a theoretical curve. The spatial correlation testing generally includes transmitting signals from a network analyzer, for example, through the channel emulator and probes. The probes radiate signals within the anechoic chamber, which are received by a standard antenna in the center of quiet zone. The standard antenna is attached to a positioner configured to move the standard antenna to pre-defined spatial locations on a fixed radius from the center of the quiet zone. The signals received by the standard antenna are measured at the different spatial locations using the network analyzer.

When the verification fails (block S217: No), the process returns to block S214, where parameters for selecting the preferred CIR files are adjusted. When the CIR files were selected using a threshold the previous threshold is increased in block S214, so that more CIR files may be selected as preferred CIR files. For example, the new threshold may be set 2 dB higher than the previous threshold. Blocks S215 and S216 are then repeated to reselect preferred CIR files having corresponding power levels higher than increased threshold, and to perform the bi-directional fading emulation for the fading channels using the reselected preferred CIR files.

When the CIR files were selected by minimizing the channel model verification metric errors, the criteria for identifying channel model verification metric errors are made more lenient in block S214. Blocks S215 and S216 are then repeated to reselect preferred CIR files having the fewest channel model verification metric errors, and to perform the bi-directional fading emulation for the fading channels using the reselected preferred CIR files.

When the verification succeeds (block S217: Yes), the process advances to block S218, where the verified bi-directional fading emulation file with the multiple fading channels is implemented by the channel emulator 140. This is the optimized bi-directional fading emulation, which balances meeting specification requirements using minimum hardware resources and the fewest number of CIR files.

FIGS. 3, 4, 5A and 5B show example results of bi-directional fading emulation file verification, e.g., performed in block S217 described above, using a F64 Channel Emulator that provides 16 input ports and 16 output ports on the BTS side and 40 channels on the DUT side to provide 16×24 bi-directional fading emulation.

Figure 3:
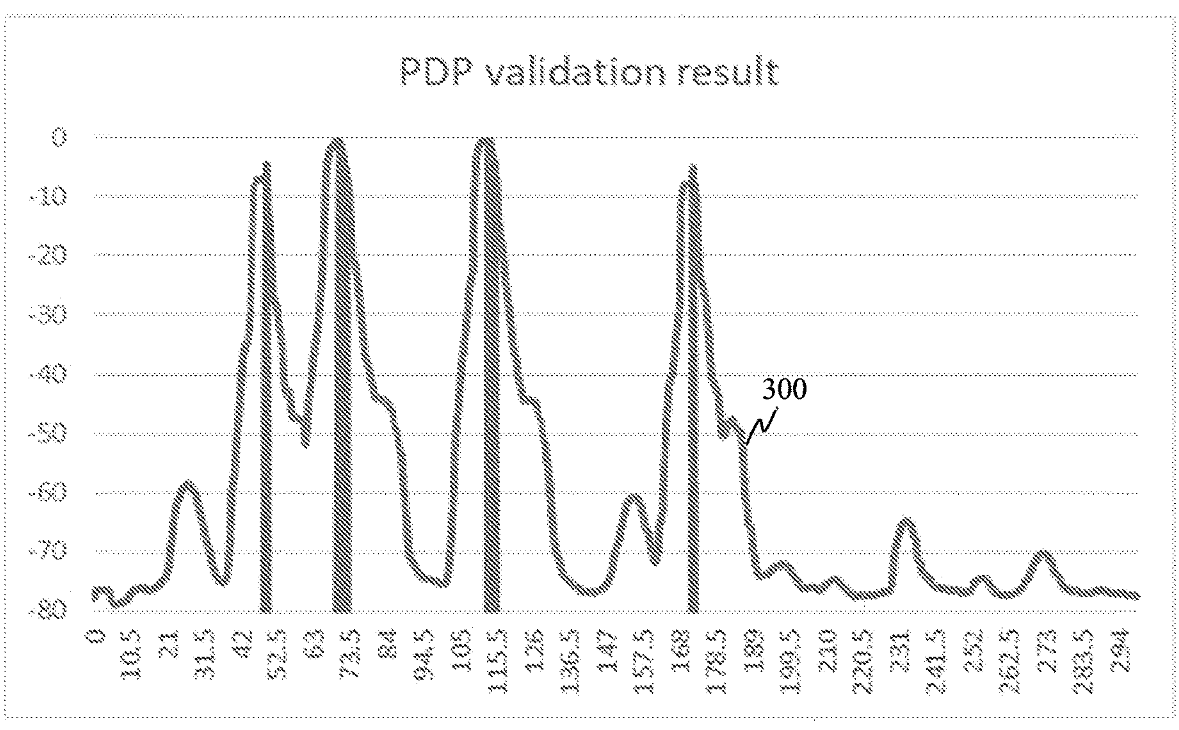
FIG. 3 is a graph showing bi-directional fading emulation file verification using PDP testing in the time domain, according to a representative embodiment.

In particular, FIG. 3 is a graph showing PDP verification result of bi-directional fading emulation file in the time domain, according to a representative embodiment. Referring to FIG. 3, trace 300 shows the power of multiple clusters measured at a reference antenna in dB as a function of time. In the depicted example, the power level peaks are measured at about 52.5 nano-second, 73.5 nano-second, 115.5 nano-second, and 168 nano-second. The power and associated times match the expected power delay profile.

Figure 4:
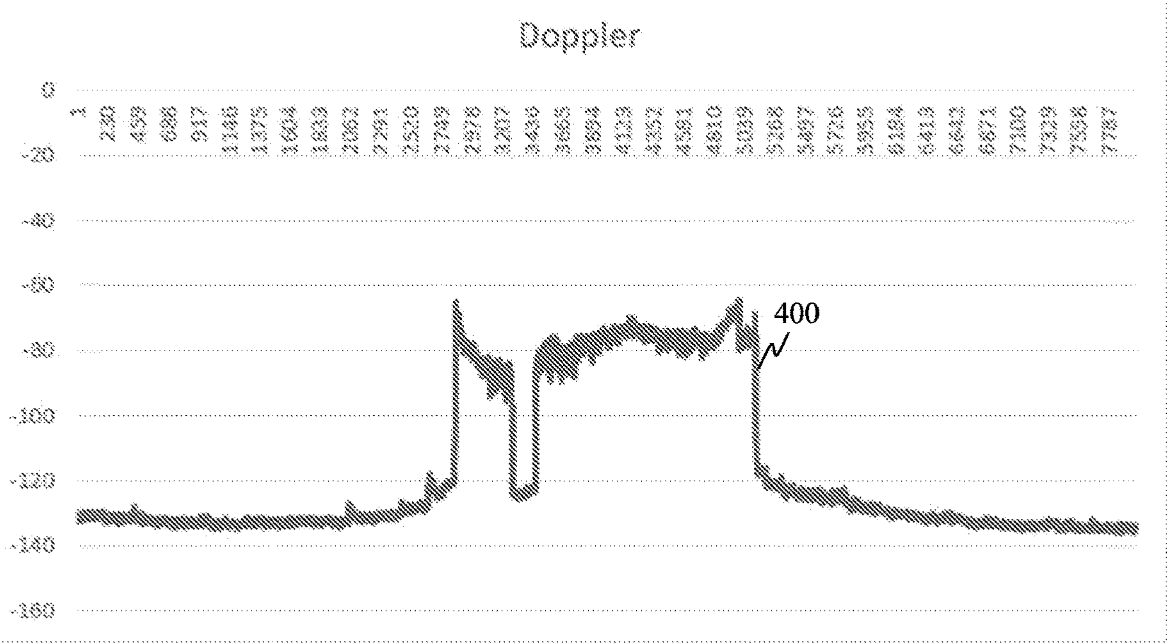
FIG. 4 is a graph showing bi-directional fading emulation file verification using Doppler testing in the frequency domain, according to a representative embodiment.

FIG. 4 is a graph showing bi-directional fading emulation file verification using Doppler testing in the frequency domain, according to a representative embodiment. Referring to FIG. 4, trace 400 shows the power of multiple clusters in dBm as a function of Doppler frequency in Hz. In the depicted example, the frequency response of the bi-directional fading emulation file is verified according to a theoretical value of the frequency response, meaning that the Doppler is correct in the frequency domain.

Figure 5A:
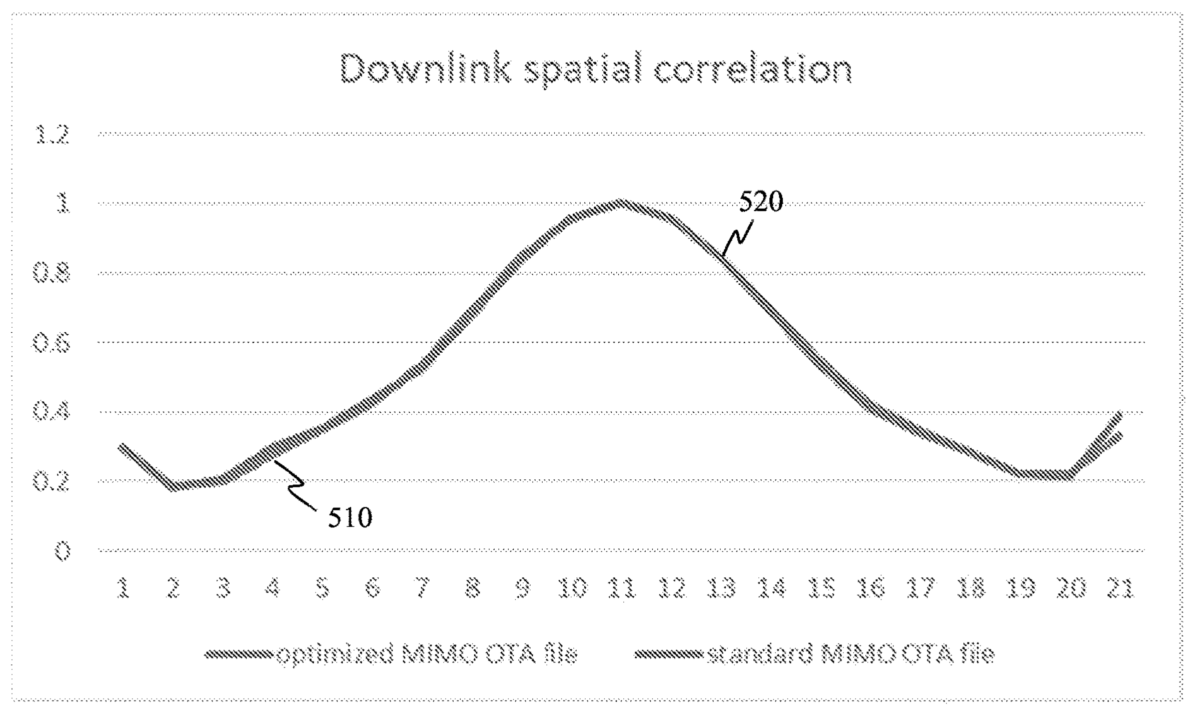
FIG. 5A is a graph showing downlink spatial correlations of the bi-directional fading emulation file in the spatial domain, according to a representative embodiment, and includes downlink spatial correlations of the standard bi-directional fading emulation file for comparison.
Figure 5B:
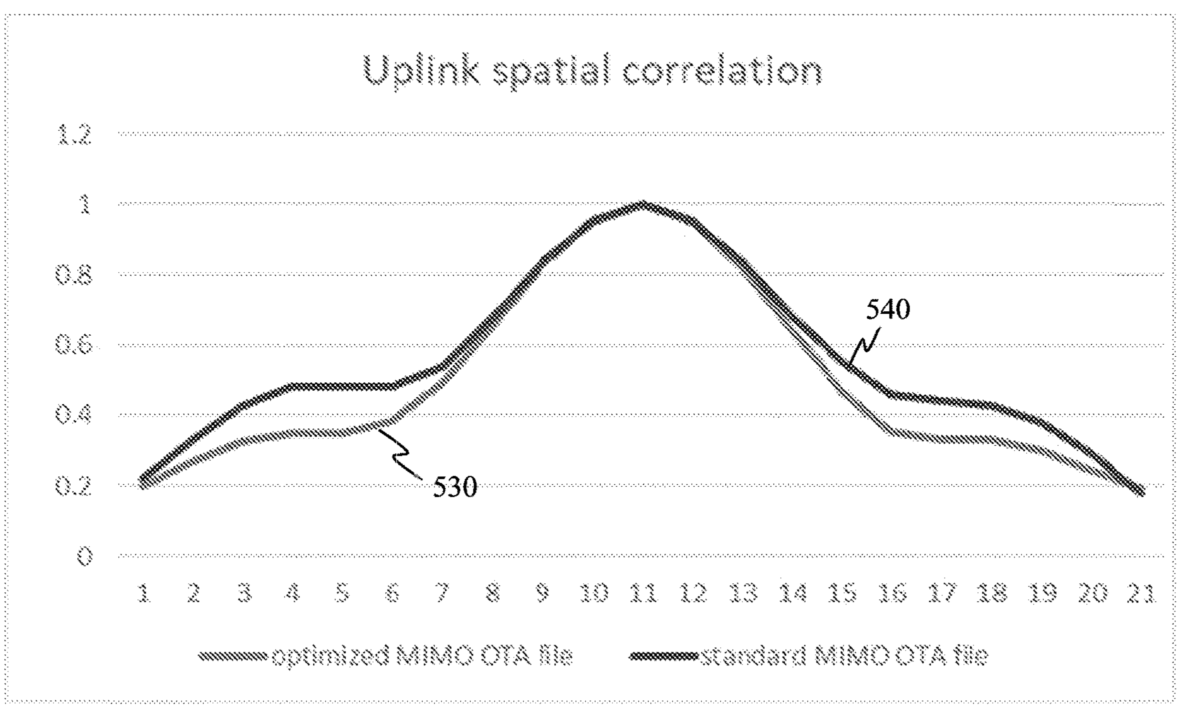
FIG. 5B is a graph showing uplink spatial correlations of the bi-directional fading emulation file in the spatial domain, according to a representative embodiment, and includes uplink spatial correlations of the standard bi-directional fading emulation file for comparison.

FIGS. 5A and 5B are graphs showing downlink and uplink spatial correlations in the spatial domain, according to a representative embodiment. Referring to FIG. 5A, trace 510 shows the downlink spatial correlation of the optimized bi-directional fading emulation file as a function of multiple clusters in the spatial domain, and trace 520 shows the downlink spatial correlation of the standard bi-directional fading emulation file. Similarly, referring to FIG. 5B, trace 530 shows the uplink spatial correlation of the optimized bi-directional fading emulation file as a function of multiple clusters in the spatial domain, and trace 540 shows the uplink spatial correlation of the standard bi-directional fading emulation file. In both FIGS. 5A and 5B, the downlink and uplink spatial correlations of the optimized bi-directional fading emulation file match quite well with the standard downlink and uplink spatial correlations, respectively, thus verifying the bi-directional fading emulation file.

Figure 6:
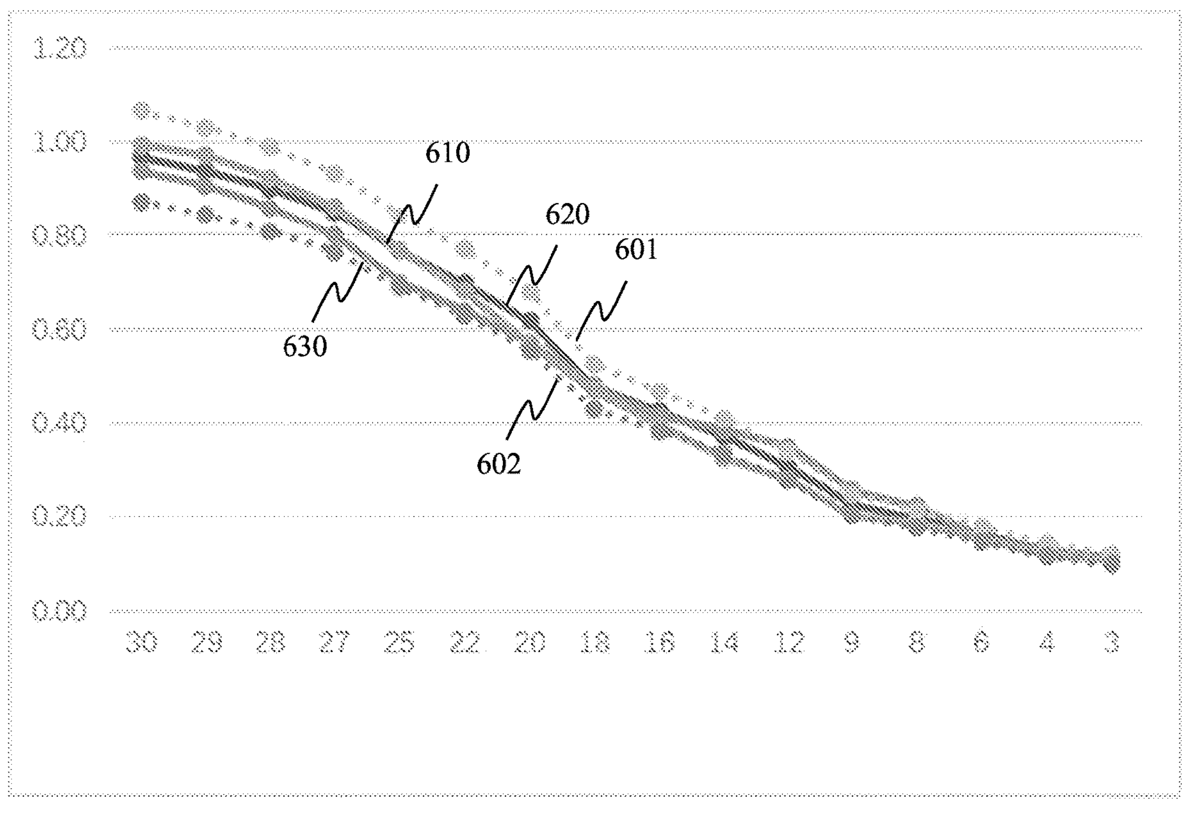
FIG. 6 is a graph showing a throughput alignment test of the bi-directional fading emulation file provided by the MIMO OTA test system, according to a representative embodiment, compared to throughput alignment tests of bi-directional fading emulation files provided by conventional MIMO OTA test systems, respectively.

FIG. 6 is a graph showing a throughput alignment test of the bi-directional fading emulation file provided by the MIMO OTA test system, according to a representative embodiment, compared to throughput alignment tests of bi-directional fading emulation files provided by conventional MIMO OTA test systems, respectively. Referring to FIG. 6, traces 601 and 602 respectively show the upper and low limits of acceptable throughput as provided by the CMMC standard, as an example. Trace 610 shows the throughput of the bi-directional fading emulation file provided by provided by the MIMO OTA test system 100, according to a representative embodiment, where the throughput is normalized with a theoretical throughput. For purposes of comparison, trace 620 shows the throughput of a bi-directional fading emulation file provided by provided by a conventional MIMO OTA test system using two interconnected F64 Channel Emulators having 48 channels, and trace 630 shows the throughput of a bi-directional fading emulation file provided by provided by a conventional MIMO OTA test system using one F64 Channel Emulator having 64 channels, as discussed above. As shown in FIG. 6, the bi-directional fading emulation files provided by the MIMO OTA test system 100 is comparable to those of the conventional MIMO OTA test systems, but has been optimized to use fewer hardware resources. Also, the power consumption of the MIMO OTA test system 100 to provide the optimized bi-directional fading emulation files is only 3000 W at maximum, in the depicted example. In comparison, the conventional MIMO OTA test system using two interconnected F64 Channel Emulators having 48 channels uses 8000 W at maximum, and the conventional MIMO OTA test system using one F64 Channel Emulator having 64 channels uses 4000 W at maximum.

Figure 7:
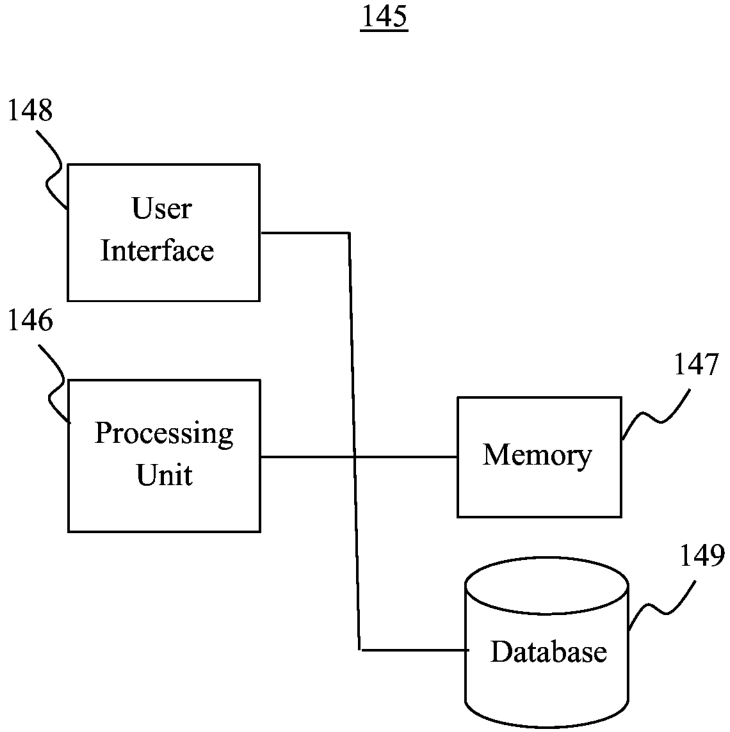
FIG. 7 is a simplified block diagram showing the controller of the channel emulator for modeling an NR DUT having multiple antennas, according to a representative embodiment.

FIG. 7 is a simplified block diagram showing the controller of the channel emulator for modeling an NR DUT having multiple antennas, according to a representative embodiment.

Referring to FIG. 7, the controller 145 includes the processing unit 146 and the memory 147 for storing instructions executable by the processing unit 146 to implement the processes described herein, as discussed above. The controller 145 further includes an interface 148 to enable user interaction, as well as a database 149 (optional) that stores various information, such as different channel models. The controller 145 may be embodied in a circuit simulator, as would be apparent to one skilled in the art.

The processing unit 146 is representative of one or more processing devices, and is configured to execute software instructions to perform functions as described in the various embodiments herein. The processing unit 146 may be implemented by a general purpose computer, a central processing unit, one or more processors, microprocessors or microcontrollers, a state machine, a programmable logic device, field programmable gate arrays (FPGAs), application specific integrated circuits (ASICs), or combinations thereof, using any combination of hardware, software, firmware, hard-wired logic circuits, or combinations thereof. The term “processor,” in particular, encompasses an electronic component able to execute a program or machine executable instructions. References to “a processor” should be interpreted to include more than one processor or processing core, as in a multi-core processor, and/or parallel processors. A processor may also refer to a collection of processors within a single computer system or distributed among multiple computer systems, such as in a cloud-based or other multi-site application. Programs have software instructions performed by one or multiple processors that may be within the same computing device or which may be distributed across multiple computing devices.

The memory 147 may include a main memory and/or a static memory, where such memories may communicate with each other and the processing unit 146 via one or more buses. The memory 147 stores instructions used to implement some or all aspects of methods and processes described herein, including the methods described above with reference to FIG. 2, for example. The memory 147 may be implemented by any number, type and combination of random access memory (RAM) and read-only memory (ROM), for example, and may store various types of information, such as software algorithms, data based models including ANN and other neural network based models, and computer programs, all of which are executable by the processing unit 146. The various types of ROM and RAM may include any number, type and combination of computer readable storage media, such as a disk drive, flash memory, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, blu-ray disk, a universal serial bus (USB) drive, or any other form of storage medium known in the art.

The memory 147 is a tangible storage medium for storing data and executable software instructions, and is non-transitory during the time software instructions are stored therein. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time. The memory 147 may store software instructions and/or computer readable code that enable performance of various functions. The memory 147 may be secure and/or encrypted, or unsecure and/or unencrypted.

Similarly, the database 149 stores data and instructions used to implement some or all aspects of methods and processes described herein. The database 149 may be implemented by any number, type and combination of RAM and ROM, for example, and may store various types of data and information, such as software algorithms, and computer programs, all of which are executable by the processing unit 146. The various types of ROM and RAM may include any number, type and combination of computer readable storage media, such as a disk drive, flash memory, EPROM, EEPROM, registers, a hard disk, a removable disk, tape, CD-ROM, DVD, floppy disk, blu-ray disk, USB drive, or any other form of storage medium known in the art. The database 149 likewise is a tangible storage medium for storing data and executable software instructions, and is non-transitory during the time software instructions are stored therein. The database 149 may be secure and/or encrypted, or unsecure and/or unencrypted.

The interface 148 may include a user and/or network interface for providing information and data output by the processing unit 146 and/or the memory 147 to the user and/or for receiving information and data input by the user. That is, the interface 148 enables the user to enter data and to control or manipulate aspects of the processes described herein, and also enables the processing unit 146 to indicate the effects of the user's control or manipulation. The interface 148 may connect one or more user interfaces, such as a mouse, a keyboard, a mouse, a trackball, a joystick, a haptic device, a microphone, a video camera, a touchpad, a touchscreen, voice or gesture recognition captured by a microphone or video camera, for example, or any other peripheral or control to permit user feedback from and interaction with the controller 145. The interface 148 may further include one or more of ports, disk drives, wireless antennas, or other types of receiver circuitry. In an embodiment, the controller 145 may be connected to an external display (not shown) to assist the user in interfacing processing unit 146. The display may show various characteristics of the channel emulator 140, such as the graphs shown in FIGS. 3-5B, for example.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

Aspects of the present invention may be embodied as an apparatus, method or computer program product. Accordingly, aspects of the present invention may take the form of an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A multiple-input multiple-output (MIMO) over-the-air (OTA) test system for modeling a device under test (DUT) having multiple antennas, the system comprising:

a base transceiver station (BTS) for sending and receiving radio frequency (RF) test signals to and from the DUT, wherein the RF test signals are modulated in accordance with a new radio (NR) signal and dynamic modulation and coding scheme;

a plurality of probes for reproducing a three-dimensional fading environment for the DUT placed in a quiet zone of an anechoic chamber in response to the RF test signals, wherein the three-dimensional fading environment is a predefined channel model provided in a standard specification or in customer requirements; and a channel emulator comprising (i) a plurality of input/output ports connectable to the BTS, (ii) a plurality of input/output ports respectively connectable to the plurality of probes, and (iii) a processing unit for performing bi-directional fading emulation with a plurality of fading channels according to the predefined channel model, wherein the processing unit of the channel emulator is programmed to:

build a plurality of channel impulse response (CIR) files for the plurality of fading channels;

select preferred CIR files from the plurality of CIR files; and revise the bi-directional fading emulation with the plurality of fading channels using the preferred CIR files, wherein unselected CIR files of the plurality of CIR files are disregarded, and wherein the plurality of probes reproduces the three-dimensional fading environment for the DUT in the quiet zone using the RF test signals adjusted by the revised bi-directional fading emulation with the plurality of fading channels.

2. The system of claim 1, wherein the processing unit is programmed to select the preferred CIR files from the plurality of CIR files by selecting CIR files having corresponding power levels higher than a previously set threshold corresponding to a minimum power level.

3. The system of claim 2, wherein the processing unit is further programmed to initially select the threshold using a single index or multiple indexes with different priorities.

4. The system of claim 2, wherein the processing unit is programmed to select the preferred CIR files by:

calculating absolute power for each CIR file of the plurality of CIR files;

normalizing a power level of the absolute power for each CIR file compared with peak power of all CIR files;

comparing the normalized power level of the absolute power for each CIR file to the threshold; and selecting the CIR files having the normalized power level exceeding the threshold as the preferred CIR files.

5. The system of claim 2, wherein the processing unit of the channel emulator is further programmed to:

perform a verification of the bi-directional fading emulation with the plurality of fading channels using the preferred CIR files; and when the verification fails, increase the threshold of the minimum power level, and then repeat previous steps to reselect preferred CIR files having corresponding power levels higher than increase threshold, and perform the bi-directional fading emulation for the plurality of fading channels using the reselected preferred CIR files.

6. The system of claim 1, wherein:

the plurality of input/output ports of the channel emulator connectable to the BTS is 16 input ports and 16 output ports, the plurality of input/output ports of the channel emulator respectively connectable to the plurality of probes is 24 input ports and 24 output ports, and the plurality of fading channels for which bi-directional fading emulation is performed are both uplink and downlink 16×24 fading channels.

7. The system of claim 1, wherein the processing unit is programmed to select the preferred CIR files by:

minimizing channel model verification metric error of the CIR files by performing an iteration loop of different random selections of the CIR files; and selecting the CIR files having fewest channel model verification metric errors as the preferred CIR files.

8. The system of claim 7, wherein minimizing the channel model verification metric error of the CIR files comprises power weighting of channel selection probability within each iteration loop.

9. The system of claim 1, wherein the predefined channel model comprises a clustered delay line (CDL) channel model having CDL channel model parameters for modeling the fading channels.

10. A method of modeling a device under test (DUT) having multiple antennas using a multiple-input multiple-output (MIMO) over-the-air (OTA) test system comprising a base transceiver station (BTS) for sending and receiving radio frequency (RF) test signals to and from the DUT, and a plurality of probes for reproducing a three-dimensional fading environment for the DUT placed in a quiet zone of an anechoic chamber in response to the RF test signals, the method comprising:

building a plurality of channel impulse response (CIR) files for a plurality of fading channels provided by a channel emulator in the MIMO OTA test system;

selecting preferred CIR files from the plurality of CIR files; and performing bi-directional fading emulation with the plurality of fading channels using the preferred CIR files, wherein remaining CIR files of the plurality of CIR files not selected are disregarded; and reproducing the three-dimensional fading environment for the DUT in the quiet zone by the plurality of probes using the RF test signals adjusted by the bi-directional fading emulation with the plurality of fading channels.

11. The method of claim 10, wherein selecting the preferred CIR files from the plurality of CIR files comprises selecting CIR files having corresponding power levels higher than a threshold corresponding to a minimum power level.

12. The method of claim 11, wherein selecting the CIR files having corresponding power levels higher than a threshold comprises:

calculating absolute power for each CIR file of the plurality of CIR files;

normalizing a power level of each CIR file compared with peak power of all CIR files;

comparing the normalized power level of each CIR file to the threshold; and selecting the CIR files having the normalized power level exceeding the threshold as the preferred CIR files.

13. The method of claim 12, further comprising:

performing a verification of the bi-directional fading emulation with the plurality of fading channels using the preferred CIR files; and when the verification fails, increasing the threshold the minimum power level, repeating previous steps to reselect preferred CIR files from the plurality of CIR files having corresponding channel power levels higher than the increased threshold, and performing the bi-directional fading emulation for the plurality of fading channels using the reselected preferred CIR files.

14. The method of claim 11, further comprising:

initially importing standard clustered delay line (CDL) channel model parameters for modeling the fading channels and multi-probe anechoic chamber (MPAC) parameters for the MIMO OTA test system; and building the plurality of CIR files using the imported CDL channel model parameters and the MPAC parameters.

15. The method of claim 10, wherein selecting the preferred CIR files from the plurality of CIR files comprises:

minimizing channel model verification metric error of the CIR files by performing an iteration loop of different random selections of the CIR files; and selecting the CIR files having fewest channel model verification metric error as the preferred CIR files.

16. The method of claim 15, wherein minimizing the channel model verification metric error of the CIR files comprises power weighting of channel selection probability within each iteration loop.

17. A non-transitory computer readable medium storing instructions for modeling a device under test (DUT) having multiple antennas using a multiple-input multiple-output (MIMO) over-the-air (OTA) test system comprising a base transceiver station (BTS) for sending and receiving radio frequency (RF) test signals to and from the DUT, and a plurality of probes, the instructions, when executed, causing a processing unit to:

build a plurality of channel impulse response (CIR) files for a plurality of fading channels provided by a channel emulator in the MIMO OTA test system;

select preferred CIR files from the plurality of CIR files; and perform bi-directional fading emulation with the plurality of fading channels using the preferred CIR files, wherein remaining CIR files of the plurality of CIR files not selected are disregarded, wherein the plurality of probes reproduce a three-dimensional fading environment for the DUT placed in a quiet zone of an anechoic chamber using the RF test signals adjusted by the bi-directional fading emulation with the plurality of fading channels.

18. The non-transitory computer readable medium of claim 17, wherein selecting the preferred CIR files from the plurality of CIR files comprises selecting CIR files having corresponding power levels higher than a threshold corresponding to a minimum power level.

19. The non-transitory computer readable medium of claim 18, wherein selecting the CIR files having corresponding power levels higher than a threshold comprises:

calculating absolute power for each CIR file of the plurality of CIR files;

normalizing a power level of each CIR file compared with peak power of all CIR files;

comparing the normalized power level of each CIR file to the threshold; and selecting the CIR files having the normalized power level exceeding the threshold as the preferred CIR files.

20. The non-transitory computer readable medium of claim 17, wherein selecting the preferred CIR files from the plurality of CIR files comprises:

minimizing channel model verification metric errors of the CIR files by performing an iteration loop of different random selections of the CIR files; and selecting the CIR files having fewest channel model verification metric errors as the preferred CIR files.

* * * * *